United States Patent
Polla et al.

(10) Patent No.: US 6,741,945 B2
(45) Date of Patent: May 25, 2004

(54) SENSOR GEOMETRY CORRECTION METHODS AND APPARATUS

(75) Inventors: Kameshwar Polla, Berkeley, CA (US); Costas J. Spanos, Lafayette, CA (US)

(73) Assignee: OnWafer Technologies, Inc., Dublin, CA (US)

(*) Notice: Subject to any disclaimer, the term of this patent is extended or adjusted under 35 U.S.C. 154(b) by 0 days.

(21) Appl. No.: 10/126,456

(22) Filed: Apr. 19, 2002

(65) Prior Publication Data

US 2002/0177916 A1 Nov. 28, 2002

Related U.S. Application Data

(60) Provisional application No. 60/285,439, filed on Apr. 19, 2001.

(51) Int. Cl.[7] .................................. G06F 19/00
(52) U.S. Cl. .................... 702/104; 702/99; 702/130
(58) Field of Search ................ 702/85, 90, 91, 702/99, 104, 130, 135; 700/108, 109, 110, 117, 121; 438/14, 17

(56) References Cited

U.S. PATENT DOCUMENTS

| | | | | |
|---|---|---|---|---|
| 5,691,921 A | * | 11/1997 | Berlin | 702/99 |
| 5,869,877 A | * | 2/1999 | Patrick et al. | 257/429 |
| 5,907,820 A | | 5/1999 | Pan | 702/155 |
| 5,967,661 A | * | 10/1999 | Renken et al. | 374/126 |
| 5,969,639 A | | 10/1999 | Lauf et al. | 340/870.17 |
| 5,970,313 A | * | 10/1999 | Rowland et al. | 438/14 |
| 5,989,349 A | | 11/1999 | Ke et al. | 118/728 |
| 6,033,922 A | * | 3/2000 | Rowland et al. | 438/14 |
| 6,051,443 A | | 4/2000 | Ghio et al. | 438/17 |
| 6,244,121 B1 | | 6/2001 | Hunter | 73/865.9 |
| 6,260,427 B1 | * | 7/2001 | Jones et al. | 73/865.9 |

FOREIGN PATENT DOCUMENTS

WO   WO 02/17030 A2   2/2002

OTHER PUBLICATIONS

"Autonomous Micro–sensor Arrays for Process Control of Semiconductor Manufacturing Processes," Darin Fisher, Mason Freed, Kameshwar Poolla and C. J. Spanos—U.C. Berkeley, Presented: Proceedings of the 38th Conference on Decision and Control– Dec. 7–10, 1999. Presentation on Dec. 10, 1999.

"Micro–sensor Arrays for Calibration, Control, and Monitoring of Semiconductor Manufacturing Processes," Darin Fisher, Mason Freed, Kameshwar Poolla and C. J. Spanos—U.C. Berkeley, Presented: 1999 IEEE International Conference on Control Applications, Aug. 22–26, 1999. Presentation on Aug. 24, 1999.

U.S. patent application # 09/643,614 Filed on Aug. 22, 2000, Docket # AWS–002.

U.S. application # 10/126,457 Filed on Apr. 19, 2002, Docket # AWS–023.

* cited by examiner

Primary Examiner—Bryan Bui
(74) Attorney, Agent, or Firm—Larry Williams

(57) ABSTRACT

Described are methods and apparatus for collecting measured parameter data for applications such as deriving response models and information required for developing and maintaining processes and process tools. The methods and apparatus are capable of deriving correction factors for the measured data and applying the corrections factors to the measure data so as to provide corrected parameter data having increased accuracy. One embodiment uses warpage geometry to derive the correction factors.

29 Claims, 3 Drawing Sheets

SENSOR GEOMETRY CORRECTION METHODS AND APPARATUS

CROSS-REFERENCE

The present application is related to U.S. patent application Ser. No. 10/126,457, entitled "DATA COLLECTION AND CORRECTION METHODS AND APPARATUS," filed Apr. 19, 2002, U.S. patent application Ser. No. 60/285,439 filed on Apr. 19, 2001, U.S. patent application Ser. No. 09/643,614, filed on Aug. 22, 2000 also published as Patent Corporation Treaty application WO 02/17030, and U.S. patent application Ser. No. 09/816,648, filed on Mar. 22, 2001; all of these applications are incorporated herein, in their entirety, by this reference.

TECHNICAL FIELD

This invention relates to methods and apparatus for deriving substantially correct parameter data for processing workpieces, more particularly, processing workpieces for electronic device fabrication.

BACKGROUND

The most successful processing of materials for electronic devices typically requires optimization and precise control of the processing environment at all process steps. Many of these process steps are performed under conditions that make it difficult or impossible to measure the desired process variables. In those cases where an important process variable cannot be readily measured, an attempt is made to correlate the parameter of interest to other measurable or controllable parameters. The accuracy and stability of these correlations, also called equipment response models, are a critical factor in determining the process capability and device yield at any given process step.

Descriptions of some of the available technologies and sensor apparatus for measuring process variables are available in the technical and patent literature. Examples of some of the technologies are described in U.S. Pat. Nos. 6,244,121, 6,051,443, 6,033,922, 5,989,349, 5,967,661, 5,907,820, and Patent Corporation Treaty application WO 02/17030.

Some of the available technologies are tethered systems in which sensors exposed to the process conditions that are to be measured have physical connections to remote facilities such as power sources and information processors, and electronic components. Other technologies use an electronics module that is coupled to the detectors on a support; the sensors and electronics module are part of a single unit that is exposed to the process conditions that are to be measured. The electronics module is necessary for a sensor apparatus with capabilities such as autonomous information processing capability, wireless communication capability, and other electronically controlled on-board capabilities.

Sensor apparatus such as that used for temperature measurements often have significant variations in their geometries that result in distortions in the temperature field being measured. In some applications, the presence of the tether or electronics module can contribute to such variations leading to an unacceptable error in the measurement data. Furthermore, the fabrication procedures used in producing the sensor apparatus can incorporates materials stress that can also produce temperature distortions that result from warpage of the sensor apparatus. For applications in which measurements are recorded at temperatures other than ambient, the sensor apparatus geometry and dimensions may be changed because of the dissimilar materials that make up the sensor apparatus.

Of course, for some applications the distortion effects may be ignored if a high degree of measurement accuracy is unnecessary. However, some of the critical process steps required for processing high-value workpieces such as semiconductor wafers for electronic device and optical device fabrication and substrates for flatpanel display fabrication do indeed require high accuracy for the values of the process conditions. For such applications, measurements of a parameter such as temperature need to be extremely accurate, particularly for the temperature uniformity across the area of the workpiece. Furthermore, applications involved with the manufacture, calibration, research, and development of process equipment for processing high value substrates require high accuracy measurements since the operation of the equipment can be limited by the accuracy of the measurements. Inaccurate data can result in the loss of millions of dollars of product in some instances. Alternatively, the inaccurate data can result in the production of products having poorer performance because the process conditions were optimized based on the inaccurate data.

Clearly, there are numerous applications requiring high accuracy methods and apparatus by which spatially resolved and time resolved equipment response models can be easily and economically developed and maintained. An example of an important application is the uniform processing of workpieces such as semiconductor wafers, flatpanel displays, and other electronic devices. Furthermore, there is a need for high accuracy methods and apparatus capable of collecting data for response models in a nonperturbing manner on unmodified process equipment running realistic process conditions. Still further, there is a need for methods and apparatus capable of correcting measurements errors that can be caused by the methods and apparatus used for the measurements.

SUMMARY

This invention seeks to provide methods and apparatus that can improve the accuracy of measured parameter data used for processing workpieces. One aspect of the present invention includes methods of deriving substantially correct data for applications such as generating data for monitoring, controlling, and optimizing processes and process tools. Another aspect of the present invention includes apparatus for deriving substantially correct data for applications such as generating data for monitoring, controlling, and optimizing processes and process tools.

It is to be understood that the invention is not limited in its application to the details of construction and to the arrangements of the components set forth in the following description or illustrated in the drawings. The invention is capable of other embodiments and of being practiced and carried out in various ways. In addition, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods and systems for carrying out aspects of the present invention. It is important, therefore, that the claims be regarded as including such equivalent constructions insofar as they do not depart from the spirit and scope of the present invention.

The above and still further features and advantages of the present invention will become apparent upon consideration of the following detailed descriptions of specific embodiments thereof, especially when taken in conjunction with the accompanying drawings.

DESCRIPTION

Figure 1:
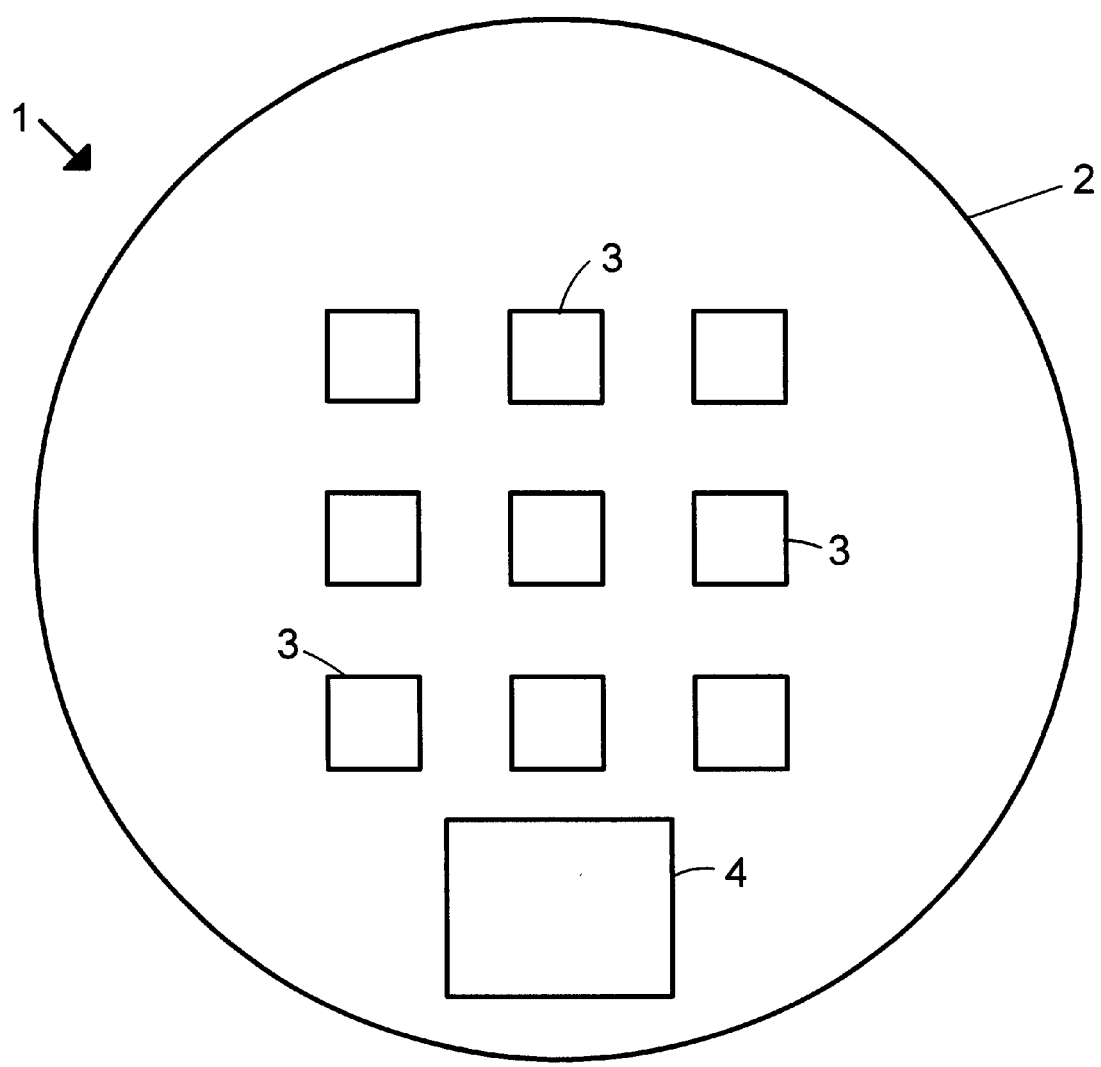
FIG. 1 is a diagram of a top view of an embodiment of the present invention.

The operation of embodiments of the present invention will be discussed below, primarily, in the context of processes for electronic device fabrication such as semiconductor wafers and flat panel displays. In addition, much of the description is presented for the application of measuring temperature as the process characteristic. However, it is to be understood that embodiments in accordance with the present invention may be used for measuring process characteristics and generating response models for essentially any processing step involving a workpiece subjected to potential temporal and/or spatial variations in process conditions. Embodiments of the present invention are not limited to the measurement of temperature nor are they limited to electronic device fabrication.

In the following description of the figures, identical reference numerals have been used when designating substantially identical elements or steps that are common to the figures.

Reference is now made to FIG. 1 wherein there is shown a block diagram for a sensor apparatus 1 for measuring a process characteristic for a workpiece in a process tool. Sensor apparatus 1 includes a base 2 such as a semiconductor wafer or flat panel display substrate, a sensor, preferably a plurality of sensors 3, and an information processor (not shown in FIG. 1) contained in an electronics module 4. Sensors 3 and electronics module 4 are supported by base 2. Sensors 3 are connected with the information processor so as to allow signals generated by sensors 3 to be provided as input to the information processor.

In a preferred embodiment, electronics module 4 contains the information processor and additional electronic components that may be needed for supporting the information processor. In general, the electronics module may contain a power source for the information processor. The electronics module may also contain components for transmitting and receiving information such as, for example, components for wireless communication. Preferably, the electronics module comprises a housing for containing the components of the electronics module. Optionally, the housing may be configured to provide protection for the components of the electronics module.

Descriptions of a sensor apparatus and typical components suitable for embodiments of the present invention are described in U.S. patent application Ser. No. 09/643,614, filed on Aug. 22, 2000 and also published as Patent Corporation Treaty application WO 02/17030 on Feb. 28, 2002, the contents of which are incorporated herein in their entirety by this reference.

In preferred embodiments of the present invention, base 2 is selected to be materially similar to the material of the workpieces. It is also preferable for sensor apparatus 1 to have dimensions similar to those of the workpieces. Specifically, it is desirable for sensor apparatus 1 to have dimensions similar to those of the workpiece so as to mimic the behavior of the workpiece in the process tool. It is preferable for sensor apparatus 1 to have dimensions so that sensor apparatus 1 can be loaded into a process tool using the same entry port used for loading the workpieces.

Optionally, for some embodiments of the present invention for semiconductor processing applications, base 2 comprises a semiconductor wafer. Similarly, for flatpanel display applications, base 2 may comprise a flatpanel display substrate.

Sensors 3 are designed to provide an electrical signal proportional to some basic, local process parameter that is representative of the process and process tool. Examples of process parameters of importance for applications such as semiconductor processing and flatpanel display processing include temperature, etch rate, deposition rate, radio frequency (RF) field, plasma potential, thermal flux, and ion flux.

Examples of typical sensor types include: Resistor, Temperature Dependent sensors (RTD) for temperature measurement; thermistors for temperature measurement; defined area probes for measuring plasma potential and measuring ion flux; Van der Paw crosses for measuring etch rate; isolated field transistors for measuring plasma potential; and current loops for measuring ion flux and measuring RF field. The numbers and types of sensors are selected based upon the specific application and process requirements.

Some embodiments of the present invention include software. The specific software commands and structures may be dependent upon the particular hardware configuration that will use the software. In the spirit of providing a general description of the software, the following description emphasizes novel features and critical features for software embodiments of the present invention. Obvious hardware dependent generalities may not be described here unless necessary. In addition, details may not be given for well-known support algorithms such as error handling, device initialization, peripheral drivers, information transfer, timer control, and other general types of command execution.

The critical process steps required for processing high-value workpieces such as semiconductor wafers for electronic device and optical device fabrication and substrates for flatpanel display fabrication require high accuracy for the values of the process conditions. For such applications, measurements of a primary parameter such as temperature uniformity across the area of the workpiece should be extremely accurate because device yield often depends on processing uniformity. Embodiments of the present invention may be required to compensate for the measurement distortion for applications that require high accuracy for the data being sought.

Figure 2:
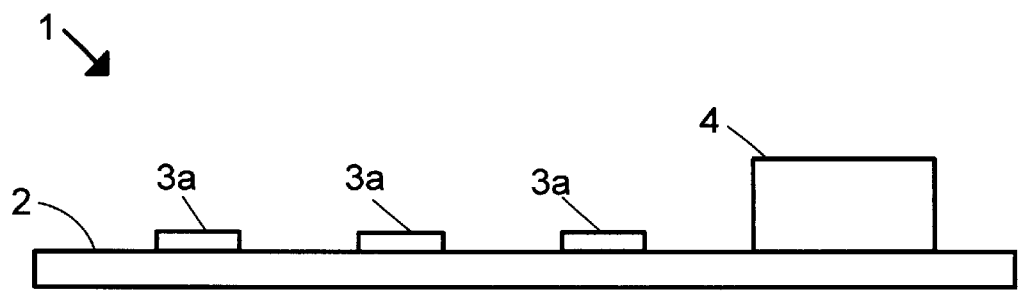
FIG. 2 is a diagram of a side view of an embodiment of the present invention.

Reference is now made to FIG. 2 wherein there is shown an embodiment of the present invention. FIG. 2 shows a side view of a sensor apparatus for measuring temperatures in a process tool such as a process tool used for manufacturing electronic devices. An example of a relevant process tool is a process tool that includes a heat source such as a bake plate for providing heat or a chill plate for removing heat. The sensor apparatus includes at least one, but more preferably, a plurality of temperature sensors 3a coupled with the top surface of a base 2 such as a silicon wafer. FIG. 2 also shows an electronics module 4 supported by base 2. Base 2 of the sensor apparatus has thickness $D_1$, which may be approximately 700 micrometers for a typical silicon wafer.

For semiconductor-processing applications, the heat sources could be sources as bake plates, chill plates as indicated earlier. However, there may be other sources of heat. For electronic device processing examples, other sources of heat that may be encountered are heat from ion bombardment and heat from exothermal chemical reactions.

The following symbols and labels will be used to describe an embodiment of the present invention for measuring temperatures in a semiconductor processing tool; for this particular description, the process tool uses a bake plate for heating a semiconductor wafer placed thereon:

u—the externally supplied heat
T—the measured temperature on the wafer surface
R—the true temperature on the wafer surface in the ideal situation where the sensor apparatus is not warped
$T_b$—the constant temperature of the heat source, such as the bake plate or chill plate
$T_o$—the ambient atmosphere.

Note that T, R, and E are functions of spatial position (x,y) and of time t. Also, a sensor apparatus is used for the measurements and the base of the sensor apparatus comprises a silicon wafer.

Embodiments of the present invention incorporate boundary conditions and equations derived from first principles in order to simulate the behavior of the sensor apparatus.

Figure 3:
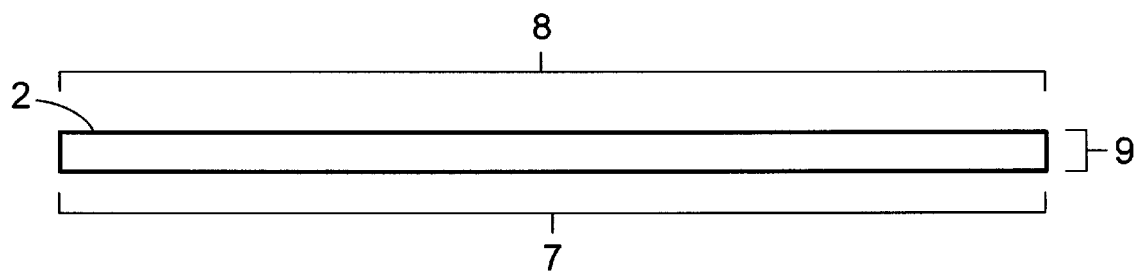
FIG. 3 is a diagram showing a side view of boundary conditions for an embodiment of the present invention.

Reference is now made to FIG. 3 wherein there is shown a side view of a base 2 for a sensor apparatus substantially the same as that described for FIG. 1 and FIG. 2. The lower surface 7 of base 2 is the first sensor apparatus boundary condition $B_1$. The upper surface 8 of base 2 is the second boundary condition $B_2$. The third boundary condition is the vertical edge 9 of base 2.

Base 2 is shown FIG. 3 as being substantially flat. If base 2 is warped, then the base is not flat. For example, the base may be heard such as concave up or concave down. Alternatively, the base may take on other shapes as a result of the warpage.

The bake plate (not shown in FIG. 3) causes heat transfer through bottom boundary 7, $B_1$, of base 2. The sensor apparatus, including base 2, may be warped due to stress built up during fabrication of the sensor apparatus. The bake plate, or other heat source or heat sink, is a distance defined as D(x,y) from the bottom surface of the sensor apparatus. As the sensor apparatus is warped, the distance is a function of spatial position (x,y) across the sensor apparatus. The warpage geometry of the sensor apparatus is D(x,y). The warpage geometry may be obtained by a variety of techniques. In one embodiment of the present invention, the warpage geometry is obtained by measuring the geometry of the sensor apparatus. In other words, measurements are made so as to obtain D(x,y) for the sensor apparatus where D is the distance of the surface of the sensor apparatus from a reference plane at different locations, (x,y), on the sensor apparatus. A method of obtaining the data is to use techniques such as using a profilometer or another technique that provides substantially the same results. Another example of a technique for obtaining warpage geometry is flatness measuring techniques such as those based on interferometry.

One embodiment of the present invention includes an assumption that the heat loss from the edge boundary $B_3$ of the sensor apparatus is negligible. The assumption is appropriate when the base of the sensor apparatus is small in comparison with the diameter of the sensor apparatus. As examples, the assumption is true when the base comprises a substrate such as a semiconductor wafer or a substrate such as that used for processing flatpanel displays. The assumption means that equation (1) can be incorporated into this embodiment of the present invention.

$$\frac{\partial R}{\partial n} = \frac{\partial T}{\partial n} = 0 \text{ at all points on the boundary } B_3 \tag{1}$$

In equation (1), n is the normal to the boundary $B_3$ of the sensor apparatus. In other embodiments of the present invention, it may not be appropriate to assume that the edge boundary condition is zero. For situations such as that, the edge boundary condition can be explicitly incorporated into the embodiment of the present condition.

For the sensor apparatus boundary $B_2$, there may be heat transfer between the sensor apparatus and the ambient atmosphere through convection. The heat transfer term can be modeled as equation (2).

$$h(T_o - T(x, y)) \tag{2}$$

In equation (2), h is a convection heat transfer coefficient. This embodiment of the present invention also includes the assumption that that radiation heat transfer across all boundaries is negligible by three orders of magnitude at operating temperatures <150° C. It should be noted that the embodiment described for this example is for applications where the temperature does not exceed about 150° C. The heat transfer term can be assumed to have the same functional form for both the measured situation where warpage occurs and the case of a substantially flat sensor apparatus. In other words, differences in the convection mechanisms due to set apparatus warpage are negligible.

For the boundary condition $B_1$, heat is transferred via conduction across the small gap separating the lower surface apparatus and the surface of the process chamber contacting the bottom surface of the sensor. For semiconductor wafer processing applications, the sensor may be in contact with a surface such as a bake plate or a chill plate. For this embodiment of the invention, the heating term is modeled using equation (3).

$$\alpha(T_b - T(x, y)) \text{ where } \alpha = \frac{k}{c\rho D_1 D(x, y)} \tag{3}$$

In equation (3), $\alpha$ is the heat conduction coefficient of the gap. For a base comprising a silicon wafer, $D_1$ is the wafer thickness, c is the specific heat of silicon, $\rho$ is the density of silicon. If the measurements are done in air, then k is the thermal conductivity of air. The distance between the wafer bottom surface and the bake/chill plate is D(x,y). Note that in the ideal case, D(x,y) assumes a constant value $D_o$ that represents a substantially non-warped sensor apparatus. Thus, in the ideal situation, the external heating term is given by equation (4).

$$\beta(T_b - T(x, y)) \text{ where } \beta = \frac{k}{c\rho D_1 D_o} \tag{4}$$

For this embodiment of the present invention, it is assumed the ambient temperature $T_o$ and the bake plate temperature, $T_b$, are constant and are the same in both the measured situation and the ideal situation, where the sensor apparatus is not warped. This assumption is necessary for some embodiments of the present invention. However, other embodiments of the present invention can incorporate detailed process models of the equipment providing the heating or cooling so that the assumption is not needed.

This embodiment of the present invention uses equation (2), equation (3), and two-dimensional heat equation (5) to model the measured temperature T on the wafer surface.

$$\frac{\partial T}{\partial t} = c\nabla^2 T + \alpha(T_b - T) + h(T_o - T) \quad (5)$$

In equation (5), c is the heat transfer coefficient of silicon, t is the time variable, and $\alpha$ is defined in equation (3).

The true temperature, R, on the wafer surface in the ideal case where the sensor apparatus is not warped can be modeled by the two-dimensional heat equation (6), which is derived using equations (2) and (4).

$$\frac{\partial R}{\partial t} = c\nabla^2 R + \beta(T_b - R) + h(T_o - R) \quad (6)$$

For this embodiment of the present invention, the correction temperature F is determined using equation (7).

$$F = D_o R - DT \quad (7)$$

In this embodiment of the present invention, the dependence of R, T, and D on the spatial coordinates (x,y) has been suppressed for clarity. The error dynamics are determined using the differential equations that describe how F evolves in time and space. For this embodiment of the present invention, the error dynamics are given by equation (8), derived using equations (5) through (7).

$$\frac{\partial F}{\partial t} = c\nabla^2 F - hF - \beta F + (\alpha - \beta)DT + h(D_o - D)T_o \quad (8)$$

This embodiment of the present invention includes using equation (9), derived for equation (7), to calculate the true temperature R.

$$R = \frac{F + DT}{D_o} \quad (9)$$

This embodiment of the present invention computes the correction term via simulating the error dynamics equation (8) with the appropriate boundary conditions. This computation incorporates the input term determined using equation (10).

$$v = (\alpha - \beta)DT + h(D_o - D)T_o \quad (10)$$

For some embodiments of the present invention, the calculation of the input term in equation (10) requires both the ambient temperature, $T_o$, and the measured wafer temperature T. If the ambient temperature is unavailable, the second term in equation (10) may be neglected, as the bulk of the corrections are due to the first warpage term. Derivation of the error dynamics, equation (8), and the appropriate boundary conditions (1) are important components of some embodiments of the present invention.

Figure 4:
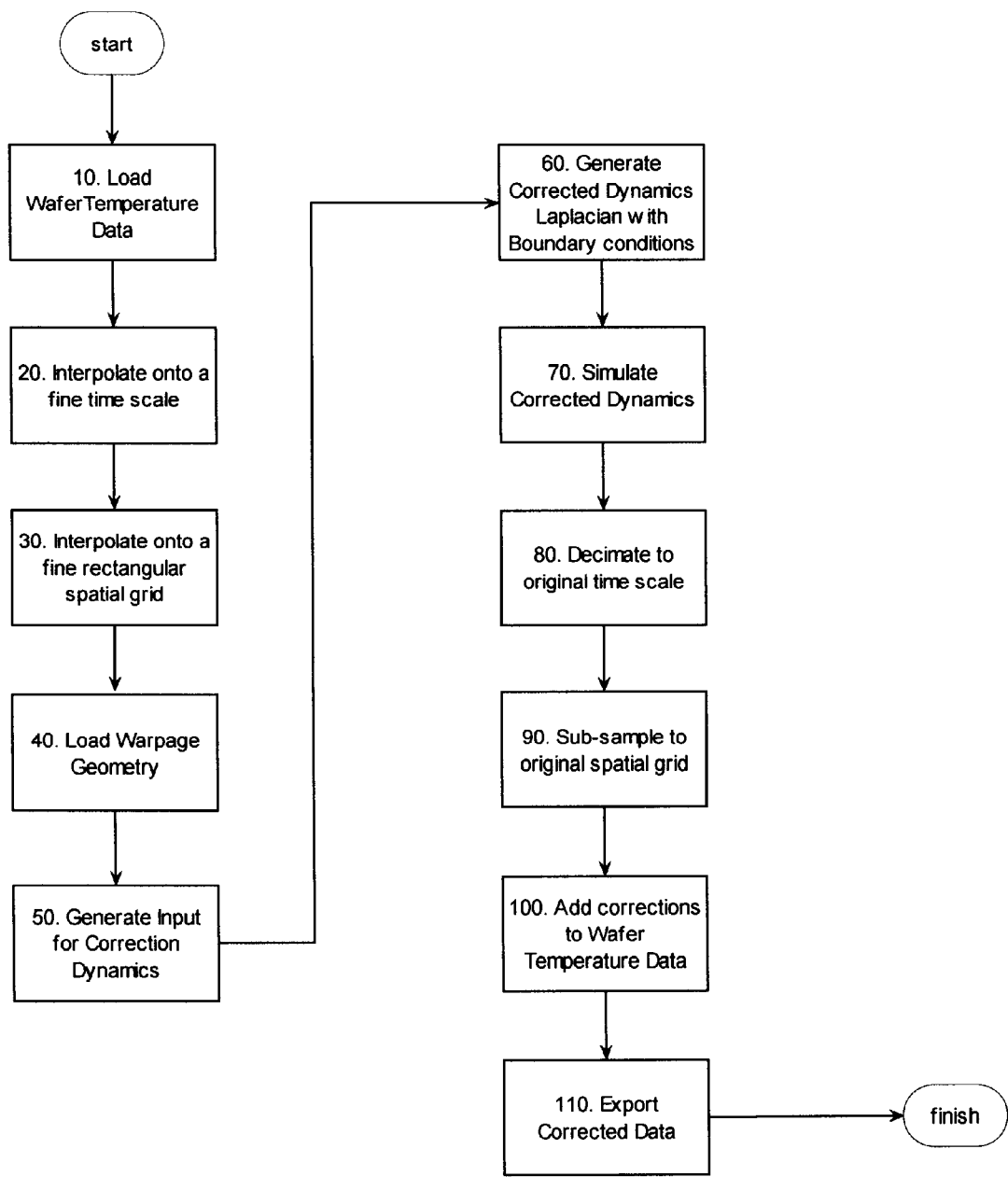
FIG. 4 is a flow chart for an embodiment of the present invention.

Reference is now made to FIG. 4 wherein there is shown a flowchart according to an embodiment of the present invention. The flowchart shown in FIG. 4 presents steps suitable for practicing an embodiment of the present invention for measuring temperatures and correcting the temperature to remove distortions in the measurements caused by warpage of the sensor apparatus. The first step after the start of the program is step 10.

Step 10 involves loading the measured wafer temperature data so that the data are available for calculations in an information processor such as a computer, a microprocessor, a central processing unit, and other types of information processing machines. The measured wafer temperature data typically will be in the form of measured temperatures associated with a time or time interval and a spatial location. The times or time interval will depend upon the selected rate at which the measurements are taken. The spatial location will depend upon the design of the sensor apparatus particularly the number of sensors and their location on the sensor apparatus. It is to be understood that the use of time-dependent temperature data is optional and may be preferable for some embodiments of the present invention. For other embodiments, it may be satisfactory to use temperature measurements such as temperatures measured at a fixed time or a set of temperatures that have been averaged over a time interval.

Step 20 involves interpolating the measured temperature data so as to obtain data for a fine time scale. Step 20 includes deriving intermediate temperatures corresponding to times between the time intervals of the measured temperatures. Step 30 is analogous to step 20 but step 30 involves spacing between the sensors of the sensor apparatus, which may also be referred to as a spatial grid. The intermediate temperatures may be obtained using techniques such as linear interpolation; optionally, non-linear interpolation techniques may also be used. The type of interpolation that is used may be a matter of designer choice or the selection may be determined by the nature of the data. Preferably, the interpolation methods are selected based on the method that is most appropriate for obtaining accurate results. In some situations, step 20 and step 30 can provide the equivalent of having additional temperature measurements.

Step 20 and step 30 are optional steps that are not required for all embodiments of the present invention. In other words, the measured data can be interpolated onto a fine spatial scale and a fine temporal scale or the original time scale may be maintained throughout the calculations. In one embodiment of the present invention, interpolations were done to obtain about 10 data points for each time interval between measurements and each spacing between the spatial grid locations of the sensors. Step 20 and step 30 may be used to improve the fidelity of some embodiments of the present invention; preferred embodiments of the present invention include step 20 and step 30. The use of a rectangular grid is not required for embodiments of the present invention; nonrectangular grids may also be used. However, the rectangular spatial grid is included in the present embodiment because the rectangular spatial grid offers simplicity in addressing the data for the calculation steps.

Step 40 involves loading the warpage geometry D(x,y). Optionally, this information may be received electronically or provided manually via a user interface. The warpage geometry is loaded so that the data is available for calculations in the information processor such as a computer, a microprocessor, a central processing unit, and other types of information processing machines.

Step 50 involves calculating the input term that determines the error correction dynamics. More specifically, this step calculates v as described in equation (10).

Step 60 involves replacing the Laplacian operator $\nabla^2$, which appears in all heat equations such as equation (8), with an approximation such as a finite differences approximation or finite elements approximation. The appropriate boundary conditions from equation (1) are incorporated in this step. Methods of implementing this step are well known; detailed descriptions are available in standard textbooks.

Step 70 involves simulating the error dynamics using equation (8) with the boundary conditions from equation (1). This is a standard partial differential equation simulation. This embodiment of the present invention includes a finite differences solver using the forward Euler method. Other embodiments of the present invention may include any of the numerous alternative solver methodologies. The output of the simulation performed in this step is the correction term E.

Step 80 is related to step 20. Step 80 includes decimating the correction term E to the original time scale used for the measurement data. For this embodiment of the present invention, the correction term E that corresponds to the measured data is selected so as to have the correction term on the time scale used for the data measurements. The correction terms for the interpolated data may be discarded.

Step 90 is related to step 30. Specifically, step 90 involves sub-sampling the correction term E spatially so as to return from the fine spatial grid back to the measured spatial grid, specifically, the original spatial grid. This means selecting from the correction terms calculated for the fine spatial grid only those correction terms corresponding to the spatial coordinates of the measured temperatures. In other words, the correction terms for the temperatures obtained for the fine spatial grid by interpolation of the spatial grid are discarded. Only the correction terms corresponding to the spatial grid for the measured temperatures are retained so that there is only a correction term for the measured temperatures.

Step 80 and step 90 are optional steps that are only needed for embodiments of the present invention that also include the previously described related step 20 and step 30, respectively. In other words, embodiments of the present invention that do not include step 20 will not need step 90. Similarly, embodiments of the present invention that do not include step 30 will not need step 100.

Step 100 includes adding the correction term E to the measured sensor apparatus temperatures so as to obtain the corrected temperatures. The corrected temperatures are more accurate in representing the temperatures that would be experienced by a workpiece for the same process conditions experienced by the sensor apparatus.

Step 110 is an optional step and is included to show a preferred embodiment of the present invention. Step 110 involves exporting the corrected data. In essence, step 110 involves making the corrected data available to a user. As an example, the corrected data may be made available by sending it to a printer. Alternatively, the data may be sent to some other form of display such as an electronic display.

The flowchart shown in FIG. 4 is but one embodiment of the present invention. It will be clear to those skilled in the art that the steps of the embodiment shown in FIG. 4 can be altered so as to obtain other embodiments of the present invention. Furthermore, even the order in which some of the steps are executed can be altered so as to obtain other embodiments of the present invention.

The steps of the flowchart can be implemented as software code using standard computer programming techniques. As is known to those skilled in the art, a variety of programming languages can be used for implementing the flowchart shown in FIG. 2. Examples of languages that are suitable include C, C++, Mathematica, MATLAB, and BASIC. Optionally, the software may be broken up into multiple files for easier readability. The software may employ subroutines for performing particular actions and commands.

Embodiments of the present invention can allow the derivation of highly accurate data from data measured with a non-ideal sensor apparatus. In other words, embodiments of the present invention allows the derivation of substantially correct temperature distributions over time and space for a workpiece in a manufacturing process; the corrected temperatures are substantially free from errors caused by warping of the sensor apparatus.

Embodiments of the invention are particularly suited to applications such as characterizing bake plates used for heating semiconductor wafers and characterizing plasma chambers for processing semiconductor wafers. Embodiments of the present invention can allow such characterizations substantially without artifacts obscuring the behavior of the process. Embodiments of the present invention can be used to expand the characterization of process operations to real-time, transient behavior, and thus making the characterization much more relevant to the processing of actual workpieces such as semiconductor wafers for electronic devices and flatpanel display substrates for flatpanel displays.

As a specific example, embodiments of the present invention can allow determination of the behavior of photoresist under precisely measured transient process conditions such as process steps involving heat transfer. The information gained using embodiments of the present invention can be used to optimize the overall process for manufacturing products such as electronic devices. Embodiments of the present invention provide opportunities for determining and controlling critical parts of processes and process conditions used in the production of high-value products. The standard technologies have been incapable of providing such opportunities without severe impracticalities.

Embodiments of present invention can be used to accurately identify workpiece temperature nonuniformities that may occur in electronic device manufacturing processes. Imperfections in components that are part of semiconductor process tools, components such as bake plates and such as plasma chamber chucks, can be localized using embodiments of the present invention. Embodiments of the present invention can be used to analyze the transient temperature behavior of workpieces and thus to determine the impact of the imperfections on the process results for the workpiece. Using embodiments of the present invention, high accuracy data can be used to identify localized temperature problems under or over the workpiece.

Embodiments of the present invention can also be used to obtain increased accuracy in "matching" process tools such as semiconductor wafer processing tools and flatpanel display processing tools. For some technologies, this methodology is referred to as chamber matching. Specifically, it is typically preferable for multiple process chambers performing the same process to provide substantially the same process results. This means that each chamber needs to produce substantially the same process conditions for workpieces. The high accuracy information that can be obtained using embodiments of the present invention allows for greater accuracy for chamber matching. In addition, embodiments of the present invention make it easier to incorporate steady state information and transient information in the chamber matching methodologies. Embodiments of the present invention can be used to help perform a much more meaningful and more accurate comparison of process chamber behavior across the entire time trajectory of the process step.

Embodiments of the present invention can be used to transform the measured data so as to obtain information for the behavior of a warped product wafer. Consequently, some embodiments of the present invention can be used to sense the temperature profiles on a product wafer, and can also be used to estimate the contribution of product wafer warpage to the quality of the product wafer. As a specific example, the warpage of the wafer can be related to the resulting error in the critical dimension of the devices fabricated on the wafer. Finally, embodiments of the present invention can be used to take into account wafer warpage as a true function of temperature. This can be done for the sensor apparatus, the product wafer, and the sensor apparatus and product wafer together.

Embodiments of the present invention can be used to correct sensor measurements by compensating for the presence of artifacts such as those caused by changes in the sensor apparatus geometry as a result of the measurement conditions. Measurement errors caused by caused material differences can be corrected using embodiments of the present invention. If a sensor apparatus is being used for measurements and the sensor apparatus comprises materials that are dissimilar to the materials of the workpiece for which the information is being gathered, then embodiments of the present invention can be used to derive corrected temperatures that represent the temperature of the workpiece experiencing the same process conditions. As a specific example, if the sensor apparatus comprises a ceramic having significantly different thermal characteristics from that of silicon, the corrected temperatures for a silicon wafer, i.e., the workpiece, can be obtained using embodiments of the present invention.

For some applications of embodiments of the present invention, there may be circumstances in which it is necessary to protect at least a portion of the sensor apparatus from the measurement environment. Some techniques that can be used to provide the protection include techniques such as engineering barrier layers, providing protective coverings, and other methods. As a consequence of serving those applications, it may be necessary to use materials and geometries for which the thermal characteristics, such as conductivity, density, specific heat, directly distort the temperature field being sensed. In other words, the warping characteristics of the sensor apparatus can be influenced by the presence of materials used for protecting the sensor apparatus. Embodiments of the present invention are suitable for obtaining temperature measurements that are corrected for the distortion caused by the materials and geometries required for protecting the sensor apparatus.

Additional embodiments of the present invention may include one or more of following options. For some embodiments of the present invention, the error dynamics partial differential equation can be discretized using a number of standard methods such as finite elements or finite difference. The resulting discretized system of equations could be simulated to compute the correction using many techniques such as backward Euler, forward Euler, and other techniques. In addition, various time and space step sizes could be used. As yet another option, a variety of spatial interpolation algorithms could be used to interpolate the measured wafer temperatures onto a finer spatial grid.

In a preferred embodiment of the present invention, a method is carried out using a sensor apparatus that has information processing capabilities for correcting measurement errors caused by the sensor apparatus. The method includes the steps of loading the sensor apparatus into the process tool, using the sensor apparatus to measure data representing a performance characteristic of the process tool, deriving correction factors for the measurements, and applying the correction factors to the measured data so as to provide substantially correct data. The method further includes converting the measured operating characteristics into digital data using the sensor apparatus. For this embodiment of the present invention, the sensor apparatus includes embedded software for operating the sensor apparatus in addition to the software for calculating the correction factors and applying the correction factors to the measured data. This means that the software may be arranged to be capable of operating from within the process environment that is being characterized by the sensor apparatus as well as outside of the process environment. In addition, the method includes performing at least one step of storing the digital data in the sensor apparatus and transmitting the digital data to a receiver.

Alternatively, embodiments of the present invention may include a system for collecting and correcting parameter measurements. The system includes a sensor apparatus for collecting measurement data and includes an external information processor. Examples of suitable external information processors include information processors such as a microprocessor, a central processing unit, and a computer. The external information processor is configured so as to be capable of generating the correction factors and applying the correction factors to the measured data so as to obtain corrected measurement data. The system also includes a communication mechanism for transmitting information between the sensor apparatus and the external information processor. Examples of suitable communication mechanisms are mechanisms that may include wireless communication devices, electrical communication cables, and optical fibers. The system is arranged so that the measurement data from the sensor apparatus can be provided as input to the external information processor. A preferred embodiment of the present invention includes wireless communication devices that use infrared technology for information transfer.

Clearly, embodiments of the present invention can be used for a wide variety of applications that require data acquisition for development, optimization, monitoring, and control of processes and process tools used for processing workpieces. Capabilities and features of embodiments of the present invention are particularly suited for processing high-value workpieces such as semiconductor wafers and flat panel displays.

FIG. 4 represents flowcharts and control flow illustrations of methods, systems, and program products according to the invention. It will be understood that each step of the flowchart and control flow illustrations, and combinations thereof can be implemented by computer program instructions. These computer program instructions may be loaded onto a computer or other programmable apparatus to produce a machine, such that the instructions that execute on the computer or other programmable apparatus create means for implementing the functions specified in the flowchart. These computer program instructions may also be stored in a computer-readable memory that can direct a computer or other programmable apparatus to function in a particular manner, such that the instructions stored in the computer-readable memory produce an article of manufacture including instruction means which implement the function specified in the flowchart. The computer program instructions may also be loaded onto a computer or other programmable apparatus to cause a series of operational steps to be performed on the computer or other programmable apparatus to produce a computer implemented process such that the instructions which execute on the computer or other programmable apparatus provide steps for implementing the functions specified in the flowchart.

Accordingly, steps of the flowchart or control flow illustrations support combinations of means for performing the specified functions, combinations of steps for performing the specified functions and program instruction means for performing the specified functions. It will also be understood that each block or step of the block diagram, flowchart or control flow illustrations, and combinations of blocks or steps in the block diagram, flowchart or control flow illustrations, can be implemented by special purpose hardware-based computer systems which perform the specified functions or steps, or combinations of special purpose hardware and computer instructions.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

While there have been described and illustrated specific embodiments of the invention, it will be clear that variations in the details of the embodiments specifically illustrated and described may be made without departing from the true spirit and scope of the invention as defined in the appended claims and their legal equivalents.

What is claimed is:

1. A method of deriving operating characteristics for a process tool used for processing workpieces the method being performed with a sensor apparatus having a plurality of detectors, the method comprising the steps of:
   a) loading a sensor apparatus including electronic devices into the process tool;
   b) measuring the operating characteristics with the sensor apparatus;
   c) converting the measured operating characteristics into digital data;
   d) deriving correction factors for warpage induced measurement distortion; and
   e) applying the correction factors to the measured data so as to generate corrected data.

2. A method according to claim 1 further comprising at least one step of:
   i. storing the digital data in the sensor apparatus,
   ii. transmitting the digital data to a receiver, and
   iii. storing the digital data in the sensor apparatus and transmitting the digital data to a receiver.

3. A method of deriving operating characteristics for a process tool used for processing workpieces the method being performed with a sensor apparatus having a plurality of detectors, the method comprising the steps of:
   a) loading a sensor apparatus including electronic devices into the process tool;
   b) measuring the operating characteristics with the sensor apparatus;
   c) converting the measured operating characteristics into digital data;
   d) deriving correction factors for warpage induced measurement distortion; and
   e) applying the correction factors to the measured data so as to generate corrected data;
   wherein step d comprises solving analytically generated equations representing the behavior of at least a portion of the sensor apparatus.

4. A method according to claim 3 wherein the sensor apparatus solves the equations.

5. A method of deriving operating characteristics for a process tool used for processing workpieces the method being performed with a sensor apparatus having a plurality of detectors, the method comprising the steps of:
   a) loading a sensor apparatus including electronic devices into the process tool;
   b) measuring the operating characteristics with the sensor apparatus;
   c) converting the measured operating characteristics into digital data;
   d) deriving correction factors for warpage induced measurement distortion; and
   e) applying the correction factors to the measured data so as to generate corrected data;
   wherein step d comprises solving analytically generated equations representing the warpage of at least a portion of the sensor apparatus.

6. A method according to claim 5 wherein the operating characteristics are temperatures.

7. A method according to claim 5 wherein the operating characteristics are selected from the group consisting of plasma potential, etch rate, deposition rate, ion density, resistivity, and thermal flux.

8. A method according to claim 5 further comprising the step of transmitting the measured operating characteristics to an external information processor for deriving the correction factors and applying the correction factors to the measured operating characteristics.

9. An apparatus for acquiring measured parameter data and generating corrected data from the measured parameter data for processing workpieces, the apparatus comprising:
   a base;
   at least one base sensor supported by the base, the sensor being capable of measuring data representing a condition of the base;
   an electronics module supported by the base;
   an information processor substantially contained in the electronics module, the information processor being connected with the at least one base sensor so as to receive data from the at least one base sensor, the information processor being capable of deriving and applying correction factors from solving analytically generated equations representing the warpage of at least a portion of the sensor apparatus.

10. An apparatus according to claim 9 wherein the electronics module further comprises a transmitter for transmitting data.

11. An apparatus according to claim 9 wherein the electronics module further comprises a transmitter for wirelessly transmitting data.

12. An apparatus according to claim 9 wherein the base sensor comprises a temperature sensor.

13. An apparatus according to claim 9 wherein the base sensor comprises at least one of resistor temperature dependent sensors, thermistors, defined area probe for measuring plasma potential, defined area probe for measuring ion flux, Van der Paw cross for measuring etch rate, isolated field transistors for measuring plasma potential, current loops for measuring ion flux, and current loops for measuring radio frequency field.

14. An apparatus according to claim 9 wherein the information processor is capable of calculating correction factors for measurement distortion caused by warpage of the apparatus.

15. An apparatus according to claim 9 wherein the electronics module further comprises a transmitter for transmitting the corrected data.

16. An apparatus according to claim 9 wherein the electronics module further comprises a transmitter for wirelessly transmitting the corrected data.

17. An apparatus according to claim 9 wherein the electronics module is capable of at least one of
   a) storing the corrected data, and
   b) storing the corrected data and transmitting the corrected data.

18. An apparatus according to claim 9 wherein the base sensor comprises a temperature sensor.

19. An apparatus according to claim 9 wherein the base sensor comprises at least one of resistor temperature dependent sensors, thermistors, defined area probe for measuring plasma potential, defined area probe for measuring ion flux, Van der Paw cross for measuring etch rate, isolated field transistors for measuring plasma potential, current loops for measuring ion flux, and current loops for measuring radio frequency field.

20. A method of deriving parameter data for a uniform workpiece using measurements from a sensor apparatus, the sensor apparatus having at least one detector for measuring the parameter data, the sensor apparatus and workpiece having dissimilar warpage properties, the method comprising the steps of:
   a) measuring the parameter data using the at least one detector;
   b) providing at least one equation for substantially representing the warpage behavior of the sensor apparatus as a function of the parameter;
   c) using the equation to derive correction factors; and
   d) applying the correction factors to the parameter data so as to obtain corrected parameter data.

21. An apparatus for generating corrected temperature data for processing substrates in a process tool, the apparatus comprising:
   a base;
   at least one base temperature sensor coupled to the base, the at least one base temperature sensor being capable of measuring the temperature of the base;
   an electronics module supported by the base, the electronics module having an information processor;
   the information processor being connected with the at least one base temperature sensor so as to receive temperature data from the at least one base temperature sensor, the information processor being capable of calculating correction factors using a warpage geometry for at least a portion of the sensor apparatus; the information processor being capable of applying the correction factors to the measured temperatures from the at least one base temperature sensor so as to obtain corrected temperature data.

22. An apparatus according to claim 21 wherein the base comprises a semiconductor wafer.

23. An apparatus according to claim 21 wherein the base comprises a flat panel display substrate.

24. A computer program product for correcting temperatures measured with a sensor apparatus, the sensor apparatus comprising a semiconductor wafer, and a plurality of temperature sensors coupled to the wafer, the computer program product comprising executable steps for:
   a) acquiring measured wafer temperature data as a function of time and spatial position;
   b) generating additional data by interpolation using the measured wafer temperature data so as to obtain temperatures for least one of a fine time scale and a fine spatial grid scale;
   c) calculating temperature correction factors using a warpage geometry for at least a portion of the sensor apparatus;
   d) reducing the correction factors of step c to at least one of the time scale of the measured temperatures and the spatial grid scale of the measured temperatures so as to correspond to step b; and
   e) applying the correction factors to the measured wafer temperature data so as to provide corrected temperatures.

25. A system for collecting and correcting parameter measurements, the system comprising a sensor apparatus for collecting measurement data, an external information processor, and a communication mechanism for transmitting information between the sensor apparatus and the external information processor, the external information processor being capable of generating correction factors using a warpage geometry for at least a portion of the sensor apparatus for correcting the parameter measurements and applying the correction factors to the measurement data so as to obtain corrected measurement data.

26. A system according to claim 25 wherein the communication mechanism is capable of wireless information transfer.

27. A system according to claim 25 wherein the communication mechanism is capable of wireless information transfer using the infrared spectrum.

28. A system according to claim 25 wherein the external information processor comprises at least one of a microprocessor, a central processing unit, and a computer.

29. A computer program product for correcting temperatures measured with a sensor apparatus, the sensor apparatus comprising a semiconductor wafer, and a plurality of temperature sensors coupled to the wafer, the computer program product comprising executable steps for:
   a) acquiring measured wafer temperature data as a function of time and spatial position;
   b) calculating temperature correction factors using a warpage geometry for at least a portion of the sensor apparatus and solving analytically generated equations representing the behavior of at least a portion of the sensor apparatus; and
   c) applying the correction factors to the measured wafer temperature data so as to provide corrected temperatures.

* * * * *

UNITED STATES PATENT AND TRADEMARK OFFICE
CERTIFICATE OF CORRECTION

PATENT NO. : 6,741,945 B2
DATED : May 25, 2004
INVENTOR(S) : Kameshwar Poolla and Costas J. Spanos It is certified that error appears in the above-identified patent and that said Letters Patent is hereby corrected as shown below:

Title page,
Item [12], Inventors, change "Polla et al." to -- Poolla et al. --
Item [56], References Cited, OTHER PUBLICATIONS, change
"U.S. Patent application #09/643,614 Filed on Aug. 22, 2000, Docket #AWS-002" to
-- U.S. Patent application #09/643,614 Filed on Aug. 22, 2000, Docket #AWS-001. --
Item [57], change "...applying corrections factors to the measure data..." to
-- ...applying corrections factors to the measured data... --

Column 3,
Line 17, change "...will be discussed below, primarily. in the context of..." to -- ...will be discussed below, primarily, in the context of... --

Column 5,
Line 34, change "Base 2 is shown FIG. 3 as being..." to -- Base 2 is shown in FIG. 3 as being... --
Line 36, change "...may be heard such as concave up..." to -- ...may be curved such as concave up... --

Column 7,
Line 36, change "...equation (9), drived for equation (7)..." to -- equation (9), derived from equation (7)... --

Column 11,
Line 15, change "...errors caused by caused material..." to -- errors caused by material... --

Signed and Sealed this

Nineteenth Day of October, 2004

JON W. DUDAS
*Director of the United States Patent and Trademark Office*